United States Patent
Patelmo et al.

(10) Patent No.: US 6,300,181 B1
(45) Date of Patent: Oct. 9, 2001

(54) PROCESS FOR MANUFACTURING AN ELECTRONIC DEVICE INCLUDING MOS TRANSISTORS WITH SALICIDED JUNCTIONS AND NON-SALICIDED RESISTORS

(75) Inventors: Matteo Patelmo, Bernareggio; Nadia Galbiati, Seregno; Giovanna Dalla Libera, Monza; Bruno Vajana, Bergamo, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/358,075

(22) Filed: Jul. 21, 1999

(30) Foreign Application Priority Data

Jul. 22, 1998 (EP) .................................................. 98830444

(51) Int. Cl.[7] .............................................. H01L 21/8238
(52) U.S. Cl. ........................ 438/210; 438/238; 438/383; 438/682
(58) Field of Search .................................... 438/698, 697, 438/696, 695, 238, 682, 681, 680, 383, 305, 306, 210; 257/538, 539, 540, 383, 384, 288, 285, 6

(56) References Cited

U.S. PATENT DOCUMENTS

| | | |
|---|---|---|
| 4,339,869 | 7/1982 | Reihl et al. . |
| 4,830,976 | 5/1989 | Morris et al. ........................... 437/47 |
| 4,906,589 * | 3/1990 | Chao ....................................... 437/44 |
| 5,001,082 * | 3/1991 | Goodwin-Johansson ............ 437/200 |
| 5,286,659 | 2/1994 | Mitani et al. . |
| 5,346,833 * | 9/1994 | Wu .......................................... 437/4 |
| 5,474,941 | 12/1995 | Mitani et al. . |
| 5,496,750 * | 3/1996 | Moslehi ................................. 437/41 |
| 5,621,232 * | 4/1997 | Ohno .................................... 257/288 |
| 5,670,812 * | 9/1997 | Adler et al. .......................... 257/347 |
| 5,705,405 * | 1/1998 | Cunningham ........................ 437/21 |
| 5,717,223 * | 2/1998 | Hack et al. ............................ 257/57 |
| 5,773,339 * | 3/1990 | Okamoto .............................. 438/210 |
| 5,780,349 * | 3/1990 | Naem ................................... 438/305 |
| 5,994,228 * | 11/1999 | Jeng et al. ............................ 438/698 |
| 6,015,753 * | 1/2000 | Lin et al. .............................. 438/682 |
| 6,051,864 * | 4/2000 | Hodges et al. ....................... 257/384 |
| 6,069,398 * | 3/2000 | Kadosh et al. ....................... 257/538 |

FOREIGN PATENT DOCUMENTS

| | | |
|---|---|---|
| 0 455 376 A2 | 11/1991 | (EP) . |
| 0 545 363 A1 | 6/1993 | (EP) . |
| 63-204638 | 8/1988 | (JP) . |
| 7-211915 | 8/1995 | (JP) . |

OTHER PUBLICATIONS

Patent Abstracts of Japan vol. 018, No. 066 (E–1501), Feb. 3, 1994 & JP 05 283427 A(Hitachi LTI Oct. 29, 1993.

Min Ye et al: "Formation of TlTl2 and Shallow Junction by As + Ion–Beam Mixing and Infrare Rapid Heat Treatment", IEEE Transactions on Electron Devices, BD. 36, NR. 3, Mar. 1, 1989, P 514–521, XP000001208.

Maier G et al: "Manufacturing Process A–SI: H–TFTS Using Ion Implantation Through the Drain and Source Elctrodes", International Display Workshop, Nagoya, Japan, Nov. 19–21 1997, pp. 873–874, XP002114339.

* cited by examiner

*Primary Examiner*—Charles Bowers
*Assistant Examiner*—Laura M Schillinger
(74) *Attorney, Agent, or Firm*—Theodore E. Galanthay; E. Russell Tarleton; Seed IP Law Group PLLC

(57) ABSTRACT

A manufacturing process that includes, in succession: depositing a gate oxide layer on a silicon substrate defining a transistor area and a resistor area; depositing a multicrystal silicon layer on the gate oxide layer; removing selective portions of the multicrystal silicon layer to form a gate region over the transistor area and a protective region completely covering the resistor area; forming source and drain regions in the transistor area, laterally to the gate region; forming silicide regions on and in direct contact with the source and drain regions, the gate region and the protective region; removing selective portions of the protective region to form a delimitation ring; and implanting ionic dopants in the resistor area, inside the area defined by the protective ring, to form a lightly doped resistor which has no silicide regions directly on it.

15 Claims, 4 Drawing Sheets

PROCESS FOR MANUFACTURING AN ELECTRONIC DEVICE INCLUDING MOS TRANSISTORS WITH SALICIDED JUNCTIONS AND NON-SALICIDED RESISTORS

TECHNICAL FIELD

The invention relates to a process for manufacturing an electronic device including MOS transistors with salicided junctions.

BACKGROUND OF THE INVENTION

As is known, some applications require logic components providing a high signal transmission speed. This high speed is generally achieved by using the technique of salicidation comprising forming a layer of self-aligned metallic silicide (known as "salicide" from "self-aligned silicide") on the junctions with the purpose of reducing the resistivity thereof. The silicide layer is formed by depositing a metal layer (preferably of titanium ($TiSi_2$), cobalt or titanium-cobalt) on the entire surface of the device and carrying out a heat treatment step that causes the metal to react with the silicon, left bare on the junctions and the gate regions, and causes the formation of metallic silicide in those regions. The metal does not react on the zones of the device which are covered by silicon oxide. The metal that has not reacted is then removed by etching with a suitable solution which leaves the metallic silicide intact. In this way both the gate regions of multicrystal silicon and the junctions come to have in parallel a metallic silicide layer of low resistivity (approx. ¾ $\mu\Omega$/square) which permits a reduction of the series resistance to the transistors and the short-circuiting of the source regions of the transistors with the substrate contacts without using metallic interconnections, providing greater freedom in the positioning of the contacts to the transistors. The "salicide" technique is described, for example, in the article "Application of the self-aligned titanium silicide process to very large-scale integrated n-metal-oxide-semiconductor technologies" by R. A. Haken in J. Vac. Sci. Technol. B, Vol. 3, No. 6, November/December 1985 and in "Self-aligned silicidation for sub half micron technologies" by K. Maex, Conference Proceedings, ULSI-X, 1995, pp. 405–414.

There are also various families of devices (non-volatile memories, smart cards etc.) for which resistors with high resistance values are required; on the other hand, manufacture of such resistors is particularly complex in processes in which the salicidation of the junctions is required at the same time.

In fact, current processes for manufacturing lightly doped and high precision resistors provide for forming LDD (Lightly Doped Drain) transistors in which source and drain junctions are formed with a gradual profile by a first implant of ionic dopants that is lighter and self-aligned with the gate and a second, heavier, implant self-aligned with spacer elements. The lightly doped precision resistors are formed during the first implant, self-aligned with a polysilicon ring; the second heavy implant is then screened in the zone of the resistors by a suitable mask. The heavy implant is made only in the region around the contact to ensure a good contact.

The salicidation process presents problems if the underlying silicon is lightly doped and is not therefore compatible with forming lightly doped resistors. Furthermore, the resistance is greatly reduced if salicide is present. This implies that it is necessary to avoid the salicidation of lightly doped resistors.

SUMMARY OF THE INVENTION

The object of the invention is to provide a process for manufacturing an electronic device comprising both lightly doped, non-salicided resistors and MOS transistors, particularly LDD, using the salicide technique.

The invention provides a process for manufacturing an electronic device including MOS transistors with salicided junctions and the electronic device thus obtained.

BRIEF DESCRIPTION OF THE DRAWINGS

For a better understanding of the invention a preferred embodiment will now be described, purely by way of non-exhaustive example and with reference to the accompanying drawings in which.

DETAILED DESCRIPTION OF THE INVENTION

Figure 1:
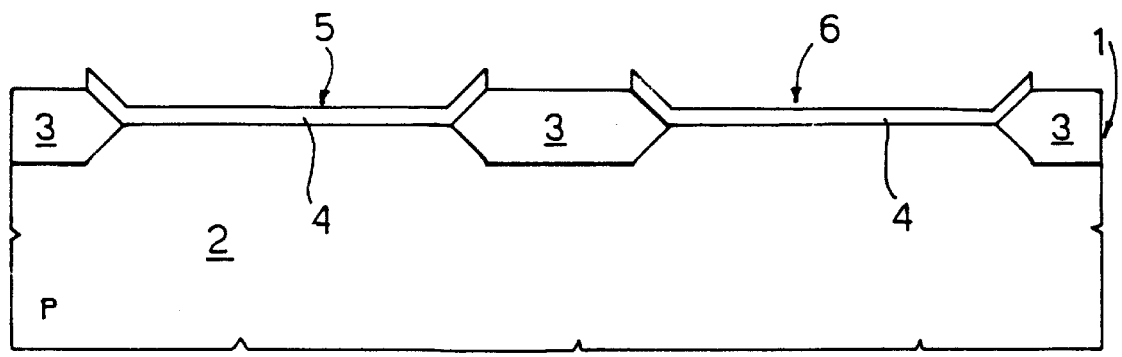
FIG. 1 shows a cross-section through a portion of a silicon wafer in a manufacture step of the device according to the invention.
Figure 2:
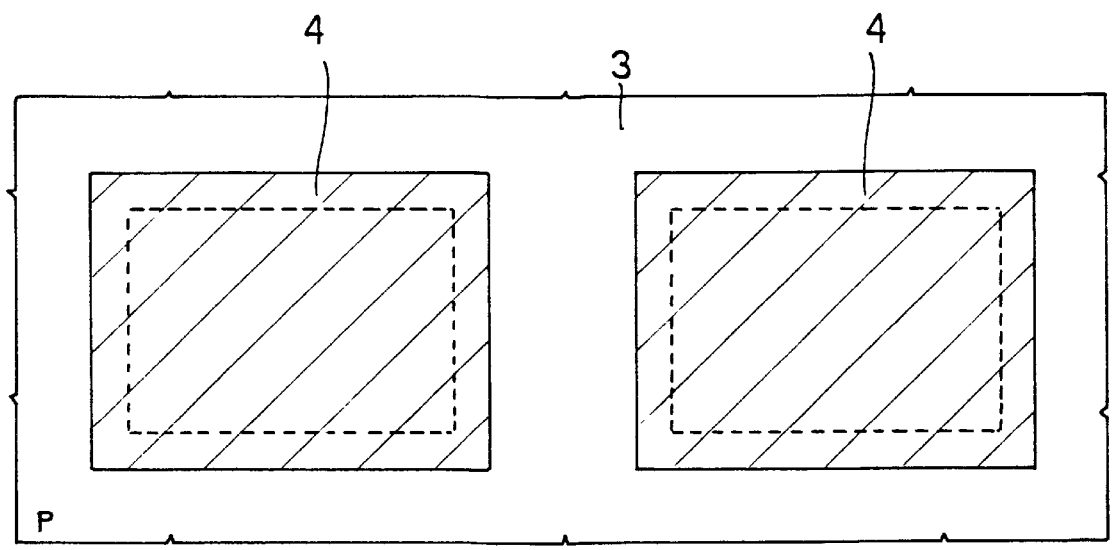
FIG. 2 shows a top view of the wafer of FIG. 1.
Figure 3:
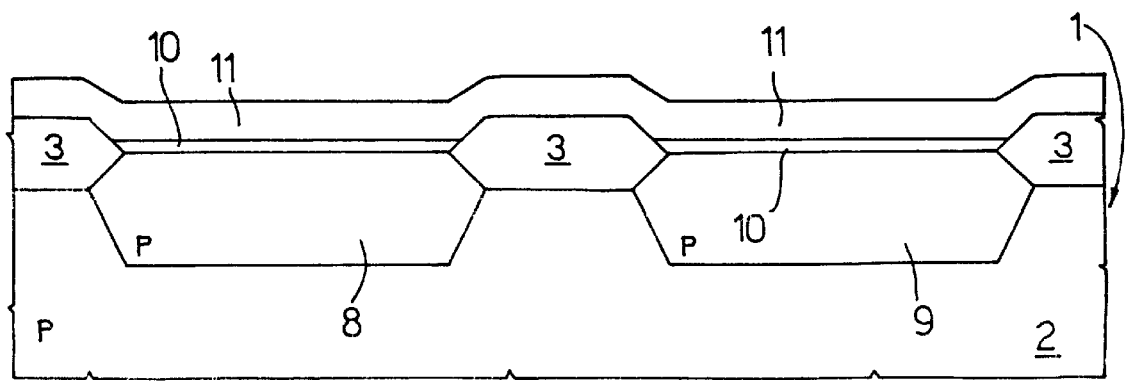
FIGS. 3 and 4 show cross-sections similar to that of FIG. 1, in subsequent manufacture steps.

FIG. 1 shows a cross-section of a wafer 1 of single-crystal silicon that comprises a P-type substrate 2 and has already been subjected to the preliminary manufacture steps according to conventional techniques for manufacturing electronic components. In the present case, field oxide regions 3 have been formed using a mask 4 of non-oxidizable material (typically formed by an oxide layer and a nitride layer, not shown); field oxide regions 3 delimit active areas in which the various components of the device are integrated; in particular, FIG. 1 shows a first active area 5 intended to house an LDD NMOS transistor and a second active area 6 intended to house an N-type lightly doped precision resistor. The shape of mask 4 can be seen in FIG. 2. P-type wells (intended to house NMOS transistors and N-type resistors) and N-type wells (intended to house PMOS transistors and P-type resistors) are then formed by subsequent masked implant steps. In the example shown, P-type wells, 8 and 9, for transistor and resistor respectively, are formed in active areas 5 and 6 (FIG. 3).

A gate oxide layer 10 is then deposited, thereon a lightly doped layer of polysilicon 11 is then deposited. The structure of FIG. 3 is thus obtained.

Figure 4:
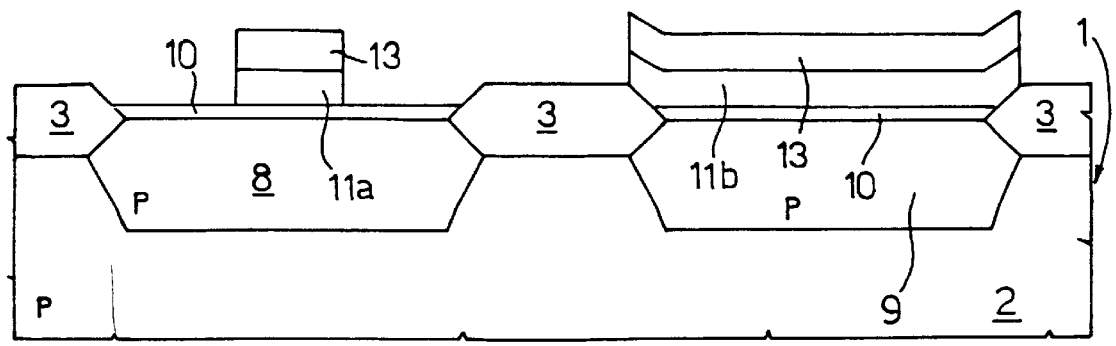
Figure 5:
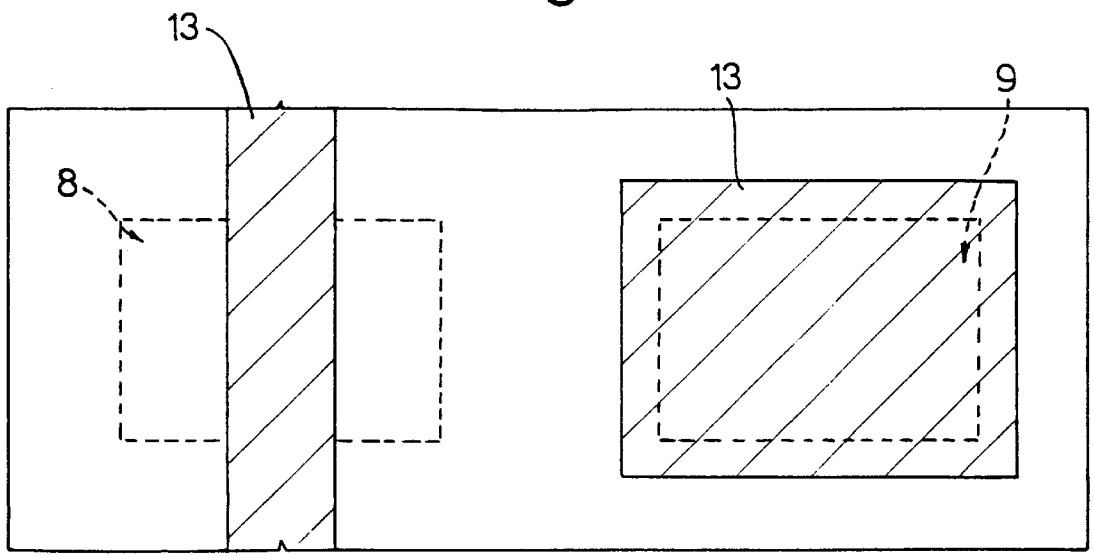
FIG. 5 shows a top view of the wafer of FIG. 4.

A gate mask 13 is then formed (FIG. 4) which covers the entire resistor well 9 and, on the transistor well, the zone where the gate region of the LDD NMOS transistor is to be formed. The shape of gate mask 13 can be seen in FIG. 5. The exposed portions of polysilicon layer 11 are then removed, using gate mask 13. The structure of FIG. 4 is thus obtained in which the region of the multicrystal silicon layer which forms the gate region of the LDD NMOS transistor is denoted by 11a and the region above the resistor well 9 is denoted by 11b.

Figure 6:
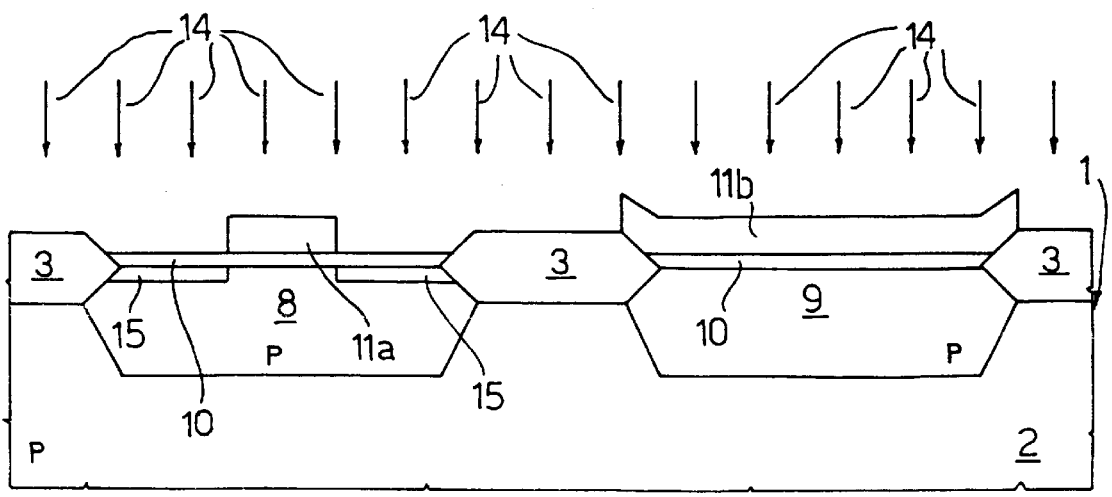
FIGS. 6–10 show cross-sections similar to that of FIG. 4, in subsequent manufacture steps.

The N zones are then separated from the P zones and vice-versa; specifically, a mask (not shown) is first formed which covers the N-type wells (not shown) and a light implant of N-type dopant is carried out, shown diagrammatically by arrows 14 in FIG. 6. N-type LDD regions 15 thus form in the well 8, on the sides of the gate region 11a; in contrast, on top of the resistor well 9 the ionic dopants accumulate in the polysilicon region 11b. The structure of FIG. 6 is thus obtained.

Figure 7:
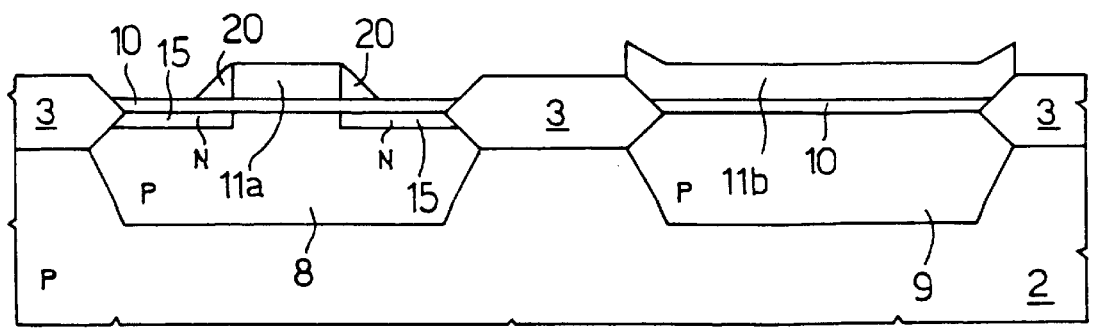

In dual manner P-type LDD regions (not shown) are then formed in the N wells (also not shown) while completely covering the P-type wells. A dielectric layer (not shown) is then deposited and etched anisotropically. Spacers 20 are thus formed in known manner on the sides of the gate region 11a, as shown in FIG. 7. In contrast, the dielectric layer is removed completely from polysilicon region 11b.

Figure 8:
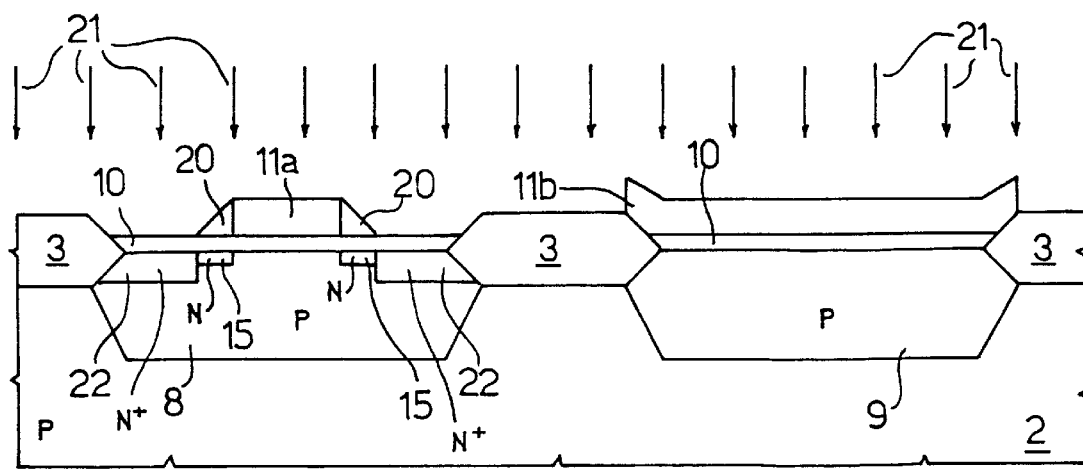

After a new masking step to separate the N zones from the P zones and vice-versa, heavy implants are carried out to form source and drain regions of NMOS and PMOS transistors. In particular, by covering the N wells with a mask not shown, a heavy implant of N-type ionic dopants is carried out, as shown in diagrammatic form in FIG. 8 by arrows 21. In this way, source and drain regions 22, more highly doped than LDD regions 15 and self-aligned with the spacers 20, form in well 8. On top of the resistor well 9 the ions accumulate in the polysilicon region 11b without penetrating the resistor well 9. The structure of FIG. 8 is thus obtained.

Figure 9:
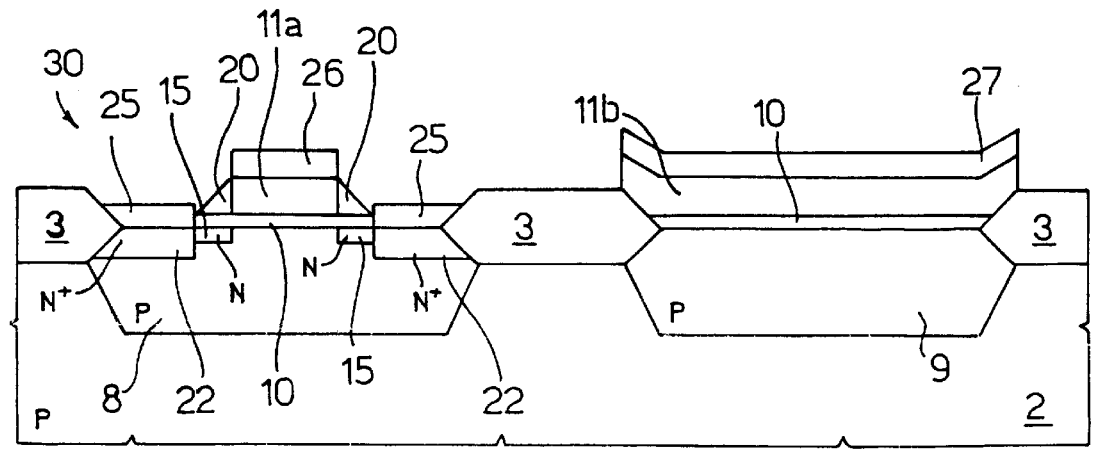
Figure 10:
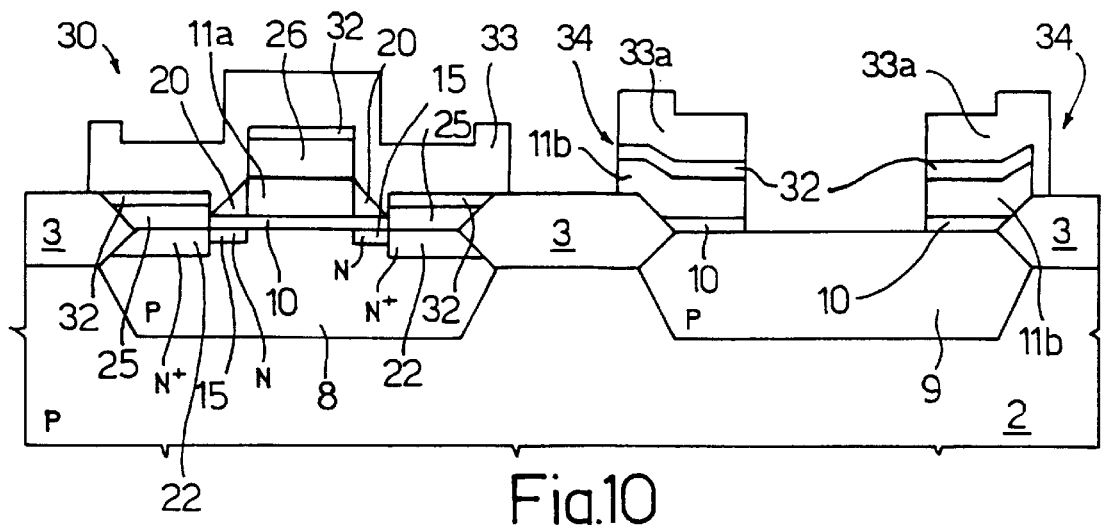

Then, after covering the P wells with a mask not shown, a heavy implant (not shown) of P-type ions is carried out to obtain source and drain regions in the N wells. The exposed silicon regions are then salicided; in particular, a metal layer is deposited on the entire surface of the device and then a heat treatment step is carried out which causes the metal layer to react with the exposed silicon, causing the formation of portions of metallic silicide denoted by 25 on top of source and drain regions 22, by 26 on top of gate region 11a and by 27 on top of polysilicon region 11b. The un-reacted metallic layer is then removed, by etching with a suitable solution that leaves the metallic silicide intact. The structure of FIG. 9 is thus obtained, in which a transistor 30, of LDD NMOS type, is virtually complete but the resistors have not yet been formed.

Figure 11:
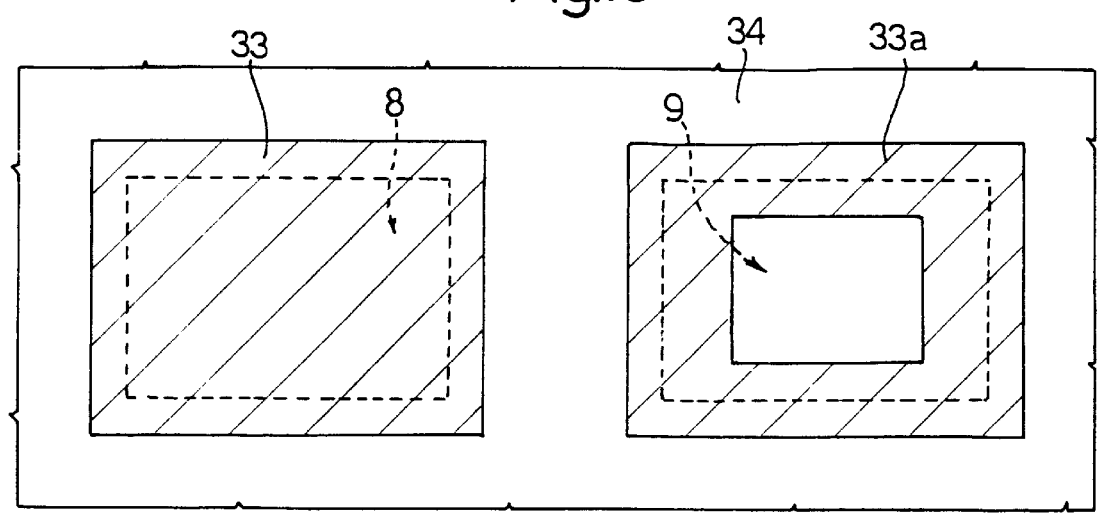
FIG. 11 shows a top view of the wafer of FIG. 10.

A thin dielectric layer 32 is then deposited to protect source and drain regions 22 and gate region 11a of the LDD transistor 30 during the subsequent processing steps. A resistor mask 33 is then formed, which covers all the LDD transistors, particularly the transistor 30, and delimits the area in which the resistor is to be implanted by means of a ring portion 33a, as shown in FIG. 11. Using mask 33, the dielectric layer 32, the polysilicon region 11b and the gate oxide layer 10 are etched, obtaining an implant delimitation structure below also termed ring stack 34.

Figure 12:
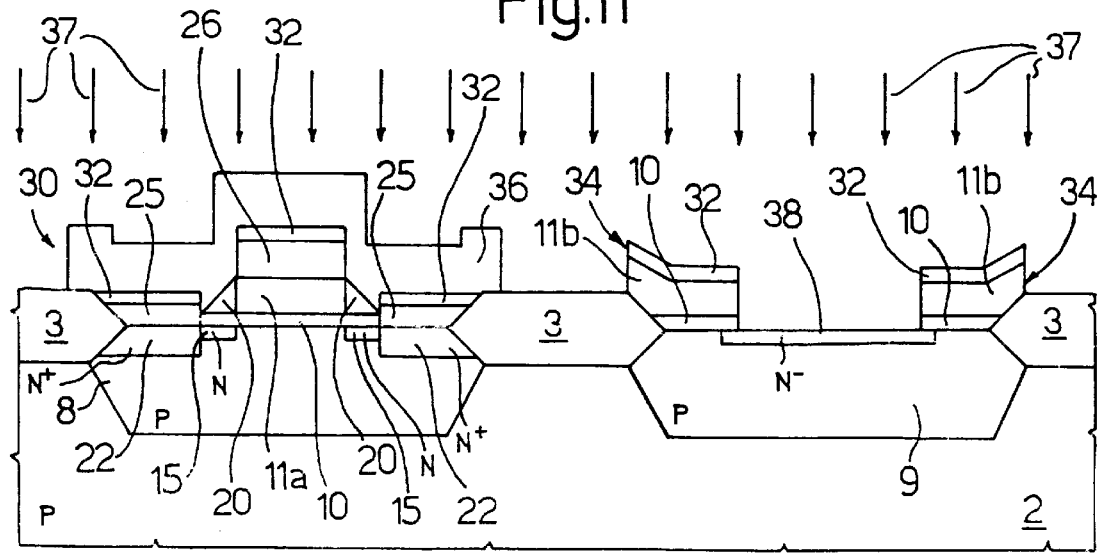
FIG. 12 shows a cross-section similar to that of FIG. 10, in a subsequent manufacture step.

Removal of resistor mask 33 is followed by a new masking step to separate N zones from P zones. In particular, an R-N mask 36 is first deposited covering the transistor 30 and the N wells in which P-type resistors are to be formed. A light implant of N-type ionic dopants is then carried out (as shown in diagrammatic form in FIG. 12 by arrows 37) to form a lightly doped resistor 38, in FIG. 12. The implant may be carried out, for example, with a dose comprised between $10^{12}$ and $10^{14}$ atoms/cm$^3$, to obtain a layer resistance comprised between 500Ω and 10 KΩ. The implant of the lightly doped resistor 38 is thus self-aligned with the ring stack 34 defined previously; the dimensions of the lightly doped resistor 38 may therefore be controlled with high accuracy.

After removing the R-N mask 36, in dual manner an R-P mask is then formed which covers the transistors and the lightly doped resistor 38 and uncovers the N wells (not shown) in which similar P-type lightly doped resistors (not shown) are to be formed.

After implanting N-type resistors and removing the R-P mask known heavy doping steps round the resistor contact zones (in a manner similar to the known process), depositing a protective dielectric layer, forming contact openings, depositing and shaping metal layers, etc., then follow.

The advantages of the present process are as follows. Primarily, it enables high-speed salicide transistors and lightly doped precision resistors to be formed in the same device. Furthermore, forming lightly doped resistors independently of high-speed transistors enables the characteristics of the various implants to be selected in the most convenient manner with respect to the specific requirements.

Compared to the current processes with silicide, the described manufacture process requires additional masks to define the ring stack 34 and selectively protect the zones of the resistors from the N and P implants; of these masks the only precision (and hence costly) mask is, however, the one for defining the ring stack; consequently, the process costs are only slightly higher than those of the standard processes, as against the possibility of manufacturing a further type of component (lightly doped resistor of high precision). Of course, if resistors of a single type of conductivity are formed (as is true of most of cases, in which only N-type resistors are formed), the number of masks required is reduced and in particular it is possible to use a single mask to etch the ring stack and implant the resistor.

Finally, it will be clear that modifications and variants may be introduced to the process and the device described and illustrated herein without thereby departing from the scope of the invention. In particular, the fact is stressed that, when forming the resistors, instead of using a precision mask and two successive masks to separate the N zones from the P zones, it is possible to use two precision masks, one to define respective ring stacks and the implant of P-type resistors, the other to define respective ring stacks and the implant of N-type resistors.

What is claimed is:

1. A process for manufacturing an electronic device having a resistor and a MOS transistor in a substrate comprising a transistor area in which said transistor is to be formed and a resistor area in which said resistor is to be formed, comprising:

depositing a silicon layer over said substrate, electrically insulated therefrom, and removing selective portions of said silicon layer to simultaneously form a gate region over said transistor area and a protective region completely covering said resistor area;

forming source and drain regions in said substrate;

forming first silicide regions on top of and in direct contact with said drain, source, and gate regions and second silicide regions on said protective region;

subsequently forming in said substrate, a resistor with no silicide regions directly on top of it; and by removing selective portions of said protective region and of said second silicide regions, and implanting ionic dopants in said resistor area.

2. The process according to claim 1 wherein forming source and drain regions comprises forming, in said transistor area, laterally to said gate region, source and drain regions of a first doping level.

3. The process according to claim 1 wherein an implant delimitation structure of closed shape is formed in removing selective portions of said protective region, and wherein implanting comprises introducing said ionic dopants into a portion of said resistor area delimited externally by said implant delimitation structure.

4. The process according to claim 1 wherein said implanting is carried out at a dose between $10^{12}$ and $10^{14}$ inclusive.

5. The process according to claim 2 wherein, before forming source and drain regions, the following are carried out:

forming, in said transistor area, LDD regions having a second doping level lower than said first doping level and aligned with said gate region;

forming spacer elements of electrically insulating material laterally to said gate region; and forming said drain and source regions aligned with said spacers.

6. The process according to claim 2, further comprising a field oxidation step carried out before forming field oxide regions separating said transistor area from said area.

7. A process for manufacturing an integrated electronic device, comprising:

forming a salicided gate region and salicided lightly-doped source and drain regions of a MOS transistor element in a first active area on a silicon substrate while simultaneously forming a protective silicon layer over a second active area on the silicon substrate; and subsequently removing the protective silicon layer over the second active area and forming a lightly-doped resistor element in the second active area in the silicon substrate, the lightly-doped resistor element having no salicided layers.

8. The process of claim 7 wherein forming MOS transistor element and the lightly-doped resistor element comprises:

forming the first and second active areas in the silicon substrate;

forming the gate region on the first active area and simultaneously forming the protective layer over the second active area from silicon;

forming source and drain regions in the silicon substrate in the first active area;

saliciding the drain, gate, and source regions;

removing selective portions of the protective layer over the active area; and implanting ionic dopants in the second active area to form the lightly-doped resistor element.

9. The process of claim 8 wherein forming the gate region and protective layer comprises depositing a silicon layer over the silicon substrate, and removing selective portions of the silicon layer to form the gate region over the first active are and a protective region completely covering the second active area.

10. The process of claim 8 wherein the forming the source and drain regions comprises forming source and drain regions of a first doping level in the first active area in the silicon substrate and laterally to the gate region.

11. The process of claim 8 wherein forming the source and drain regions comprises forming source and drain regions of a first doping level in the first active area and laterally to the gate region; forming in the first active area lightly-doped regions having a second doping level lower than the first doping level and aligned with gate region; forming spacer elements of electrically insulating material laterally to the gate region; and forming the drain and source regions aligned with the spacers.

12. The process of claim 8 wherein removing selective portions of the protective layer comprises removing selective portions of the protective layer over the second active area to form an annular protective layer.

13. A process for manufacturing an electronic device having a resistor and a MOS transistor in a substrate having a transistor area in which the transistor is to be formed and a resistor area in which the resistor is to be formed, the process comprising:

depositing a silicon layer over the substrate, electrically insulated therefrom, and removing selective portions of the silicon layer to form a gate region over the transistor area and a protective region completely covering the transistor area;

forming, in the transistor area, laterally to the gate region, source and drain regions of a first doping level;

forming first silicide regions on top of and in direct contact with the drain, source, and gate regions, and forming second silicide regions on the protective region; and forming in the substrate a resistor with no silicide regions directly on top of it, comprising removing selective portions of the protective region and of the second silicide regions, and implanting ionic dopants in the resistor area.

14. A process for manufacturing an electronic device having a resistor and a MOS transistor in a substrate that includes a transistor area in which the transistor is to be formed and a resistor area in which the resistor is to be formed, the process comprising:

depositing a silicon layer over the substrate, electrically insulated therefrom, and removing selective portions of the silicon layer to form a gate region over the transistor area and a protective region completely covering the transistor area;

forming, in the transistor area, laterally to the gate region, source and drain regions of a first doping level;

forming first silicide regions on top of and in direct contact with the drain, source, and gate regions, and forming second silicide regions on the protective region; and forming in the substrate a resistor with no silicide regions directly on top of it, comprising removing selective portions of the protective region to form an implant delimitation structure of closed shape and removing selective portions of the second silicide regions, and implanting ionic dopants in the resistor area, comprising introducing the ionic dopants into a portion of the resistor area delimited externally by the implant delimitation structure.

15. A process for manufacturing an integrated electronic device, comprising:

forming a first and second active areas in a silicon substrate;

forming a MOS transistor element in the first active area on the silicon substrate by forming a gate region on the first active area and a protective layer over the second active area through depositing a silicon layer over the silicon substrate and removing selective portions of the silicon layer to form the gate region over the first active area and the protective region completely covering the second active area, forming source and drain regions in the silicon substrate in the first active area, and saliciding the drain, gate, and source regions in the first active area; and subsequently forming a lightly-doped resistor element in the second active area in the silicon substrate, comprising removing selective portions of the protective area over the second active area and implanting ionic dopants in the second active area.

* * * * *

UNITED STATES PATENT AND TRADEMARK OFFICE
CERTIFICATE OF CORRECTION

PATENT NO. : 6,300,181 B1
DATED : October 9, 2001
INVENTOR(S) : Matteo Patelmo et al.

It is certified that error appears in the above-identified patent and that said Letters Patent is hereby corrected as shown below:

<u>Title page,</u>
Item [75], "Matteo Patelmo, Bernareggio" should read as -- Matteo Patelmo, Trezzo sull' Adda --.

<u>Column 5,</u>
Line 40, "from said area" should read as -- from said resistor area --.
Line 55, "forming MOS transistor" should read as -- forming the MOS transistor --.

Signed and Sealed this

Sixteenth Day of July, 2002

*Attest:*

JAMES E. ROGAN
*Attesting Officer*     *Director of the United States Patent and Trademark Office*